(12) United States Patent
Hu et al.

(10) Patent No.: US 6,693,830 B1
(45) Date of Patent: Feb. 17, 2004

(54) SINGLE-POLY TWO-TRANSISTOR EEPROM CELL WITH DIFFERENTIALLY DOPED FLOATING GATE

(75) Inventors: Yongzhong Hu, San Jose, CA (US); Jein-Chen Young, Milpitas, CA (US)

(73) Assignee: Lattice Semiconductor Corp., Hillsboro, OR (US)

( * ) Notice: Subject to any disclaimer, the term of this patent is extended or adjusted under 35 U.S.C. 154(b) by 227 days.

(21) Appl. No.: 10/011,549

(22) Filed: Oct. 22, 2001

(51) Int. Cl.[7] ............................................. G11C 16/04
(52) U.S. Cl. ............................. 365/185.28; 365/185.1
(58) Field of Search ......................... 365/185.28, 185.1; 257/318

(56) References Cited

U.S. PATENT DOCUMENTS

| | | | |
|---|---|---|---|
| 5,648,669 A | * | 7/1997 | Sethi et al. ................ 257/318 |
| 5,969,992 A | | 10/1999 | Mehta et al. |
| 5,999,449 A | | 12/1999 | Mehta et al. |
| 6,157,568 A | * | 12/2000 | Schmidt ................... 365/185.1 |
| 6,172,392 B1 | | 1/2001 | Schmidt et al. |
| 6,232,631 B1 | * | 5/2001 | Schmidt et al. ............. 257/315 |
| 6,294,811 B1 | | 9/2001 | Fong et al. |

* cited by examiner

Primary Examiner—Van Thu Nguyen
Assistant Examiner—Tuan T. Nguyen

(57) ABSTRACT

An EEPROM cell includes a sense transistor and a select transistor, each having a first active region (110, 114) formed in a substrate, and sharing a second active region (112). The EEPROM cell may also include a floating gate (125) having a first portion (FG2) forming a gate region for said sense transistor, and a second portion (FG1) overlying the second active region and forming a program junction with said second active region. The first portion of said floating gate has a concentration of an impurity greater than a concentration of said impurity in the second portion of the floating gate.

23 Claims, 7 Drawing Sheets

FIGURE 4
(A - A')
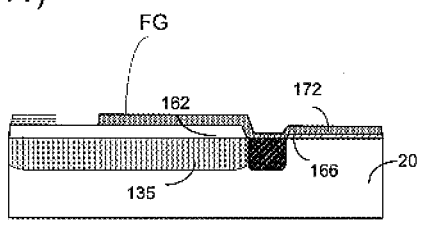
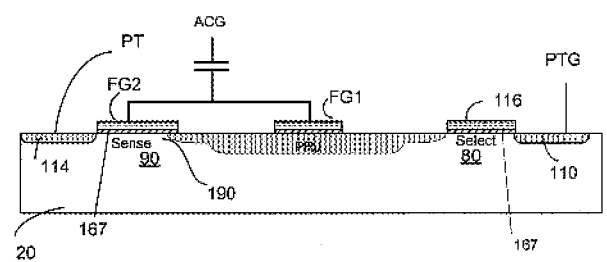
FIGURE 5
(B -- B')

SINGLE-POLY TWO-TRANSISTOR EEPROM CELL WITH DIFFERENTIALLY DOPED FLOATING GATE

BACKGROUND OF THE INVENTION

1. Field of the Invention

This invention relates generally to semiconductor devices, and more particularly, to electrically erasable programmable read only memory ("EEPROM") cells.

2. Description of the Related Art

The trend in construction of Electrically Erasable Programmable Read Only Memory (EEPROM) cells follows the general trend of semiconductor process technology in the move toward defining smaller device features. Non-volatile memory device designers strive to increase the performance of devices, while decreasing device dimensions and consequently increasing circuit density. In addition, in EEPROM devices used for programmable logic devices, designers strive to reduce power requirements of devices by reducing program and erase voltage requirements. Generally, arrays of individual memory cells are formed on a single substrate and combined with sense and read circuitry, and connected by row-wise and column-wise conductive regions or metallic conductors to allow for array wide bulk program and erase as well as selected bit programming.

In the past, conventional EEPROMs used "stacked gate" (or dual-poly) cells, wherein multiple applications of polysilicon formation were required to build cell structures. Recently, the conventional "stacked gate" EEPROM structure has given way to different cell designs and array architectures, all intended to increase density and reliability in the resulting circuit. Stacked gate devices utilizing Fowler-Nordheim tunneling to program and erase the floating gate gave way to single-layer polysilicon-based cells such as that set forth in U.S. Pat. No. 4,924,278, a schematic of which is shown in FIG. 1.

The EEPROM structure disclosed therein utilizes a single layer of polycrystalline silicon and a control gate formed in the silicon substrate to eliminate the need to form a separate control gate and floating gate in two layers of polysilicon. The EEPROM structure is made up of three separate NMOS transistors: a write transistor, a read transistor, and a sense transistor. In order to give the floating gate a positive charge (program) or negative charge (erase), electron tunneling, for example using the well-known Fowler-Nordheim tunneling technique, may be performed by applying the appropriate voltage potentials between the floating gate and a region, such as a drain region, of a transistor. Upon applying the appropriate voltage potentials, electron tunneling occurs through a tunnel oxide layer between the floating gate and the region.

An exemplary method of programming, erasing and writing to the cell in FIG. 1 is given by Table 1:

TABLE 1

|  | WL | BL | PT | PTG | Substrate | ACG |
|---|---|---|---|---|---|---|
| Read | $V_{cc}$ | ground | $V_{sense}$ | ground | ground | 0 |
| Program | $V_{pp}+$ | $V_{pp}$ | ground | ground | ground | 0 |
| Erase | $V_{cc}$ | ground | float | $V_{pp}$ | ground | $V_{pp}+$ |

As the feature sizes of EEPROM cells are scaled downward, the three-transistor EEPROM cells exhibit certain scalability, cost and reliability limitations. First, since three transistors (write, sense and read) form the typical EEPROM cell, the size of the EEPROM cell is large. Also, with a three-transistor cell, three oxide layers are needed that may vary in thicknesses requiring complex process steps to form the three tunnel oxide layers of varying thicknesses. Second, the manufacturing process for a smaller EEPROM cell becomes more complex and, accordingly, manufacturing costs rise as transistor channel lengths are reduced. For example, as the channel length of a transistor of the EEPROM cell is scaled downward, the thickness of the gate oxide overlying the channel must also be reduced since the gate oxide thickness must be scaled with the channel length. In view of the fact that EEPROM cells already have a complex process to form multiple oxide thicknesses, additional oxide thicknesses for the transistors would add additional steps to further complicate the manufacturing process and thereby increase manufacturing costs.

Alternative embodiments to the single poly EEPROM cell wherein the cell designers strove to achieve a two-transistor cell are also known. In such embodiments, a separate tunnel path is required to remove electrons from the floating gate of the cell. However, in such embodiments, the separate tunnel path is not optimized for tunneling though the use of doping technologies in the construction of the cell. In alternative embodiments, tunneling over an entire channel is used.

In both such embodiments, one portion of the structure which is critical to performance is the oxide through which electrons tunnel onto and off of the floating gate. Degradation in the oxide due to performance or in the manufacturing process will adversely affect the ability of the device to store charge. One of the most critical areas of oxide performance is over the program junction region where electrons are added to and removed from the floating gate. The aforementioned cell structures require, in a number of embodiments, a minimum oxide thickness of about 90–100 Angstroms for the program junction oxide region due to the presence of the relatively high electric field across the oxide during the life of the cell.

Any number of solutions have been adopted for increasing the integrity of the gate oxide regions. Development efforts in EEPROM device technology have focused on increasing the programming speed, lowering programming voltages, increasing data retention time, reducing cell erasure times and reducing cell dimensions. Many of the foregoing research goals can be addressed through development of materials and processes for the fabrication of the floating-gate electrode.

Over time, the EEPROM memory cell will be written and erased repeatedly as data is stored and removed from the memory cell. Since the EEPROM memory cell relies on charge exchange between the substrate and the floating-gate electrode, considerable stress is placed on the tunnel oxide underlying the floating-gate electrode. The charge-induced stress in the tunnel oxide can cause charge trapping sites to form within the tunnel oxide. The formation of these charge trapping sites is undesirable because, once formed, electrical current can leak through the tunnel oxide layer from the floating-gate electrode to the substrate. When charge leaks off the floating-gate electrode a data error occurs in the EEPROM memory cell.

One solution to the tunnel oxide leakage problem is to form thicker oxide layers within the EEPROM device. By providing more oxide, the formation of a small number of charged trapping sites can be tolerated without deleterious current leakage in the device. While fabricating the oxide layers to greater thicknesses reduce charge leakage problems, the thicker oxide layers prevent scaling of the overall size of the EEPROM memory cell. However, scaling down (reducing component size) of transistors having large oxide thicknesses cannot be achieved due to basic device physics.

Another problem associated with EEPROM devices having relatively thick oxide layers relates to programming and erasing speed. As the thickness of the oxide layers increase, especially the tunnel oxide, the time required to transfer a charge between the substrate and the floating-gate electrode also increases due to a reduction of tunneling currents under the same applied voltages.

SUMMARY OF THE INVENTION

The invention, roughly described, comprises an EEPROM cell having improved programming and erase characteristics. In this embodiment, the EEPROM may include a sense transistor and a select transistor, each having a first active region formed in a substrate, and sharing a second active region. The EEPROM cell may also include a floating gate having a first portion forming a gate region for said sense transistor, and a second portion overlying the second active region and forming a program junction with said second active region. In this embodiment, the first portion of said floating gate has a concentration of an impurity greater than a concentration of said impurity in the second portion of the floating gate. The EEPROM may further include a control region formed in the substrate and underlying a third portion of said floating gate.

In an alternative embodiment, the invention comprises a memory cell having improved programming performance. The cell may include a floating gate having at least a first region with a first impurity concentration and a second region with a second impurity concentration different from said first impurity concentration. The cell also includes a first active region formed in a substrate, a control gate formed adjacent to said first active region; and a second active region formed in the substrate adjacent to said control gate and said second active region. The second active region includes a program junction region underlying said first region of said floating gate.

In yet another embodiment, a method of fabricating a memory cell is provided. The method may include the steps of: forming active regions in a semiconductor substrate having a floating gate overlying at least portions of said active regions to construct at least a first and a second tunneling regions; masking a first portion of said floating gate region forming said at least first tunneling region; implanting a dopant having a concentration of an impurity into said floating gate; and removing said mask.

In a unique aspect of this method, the mask used is that which is typically used during manufacture of complementary devices formed on a single integrated circuit such that additional masking steps need not be used in implementing the invention.

These and other objects and advantages of the present invention will appear more clearly from the following description in which the preferred embodiment of the invention has been set forth in conjunction with the drawings.

BRIEF DESCRIPTION OF THE DRAWINGS

The invention will be described with respect to the particular embodiments thereof. Other objects, features, and advantages of the invention will become apparent with reference to the specification and drawings in which:

FIG. 4 is a view along line A–A' of FIG. 2 showing the EEPROM cell formed in accordance with the present invention.

FIG. 5 is a view along line B–B' of FIG. 2 showing the EEPROM cell formed in accordance with the present invention.

DETAILED DESCRIPTION

Figure 1:
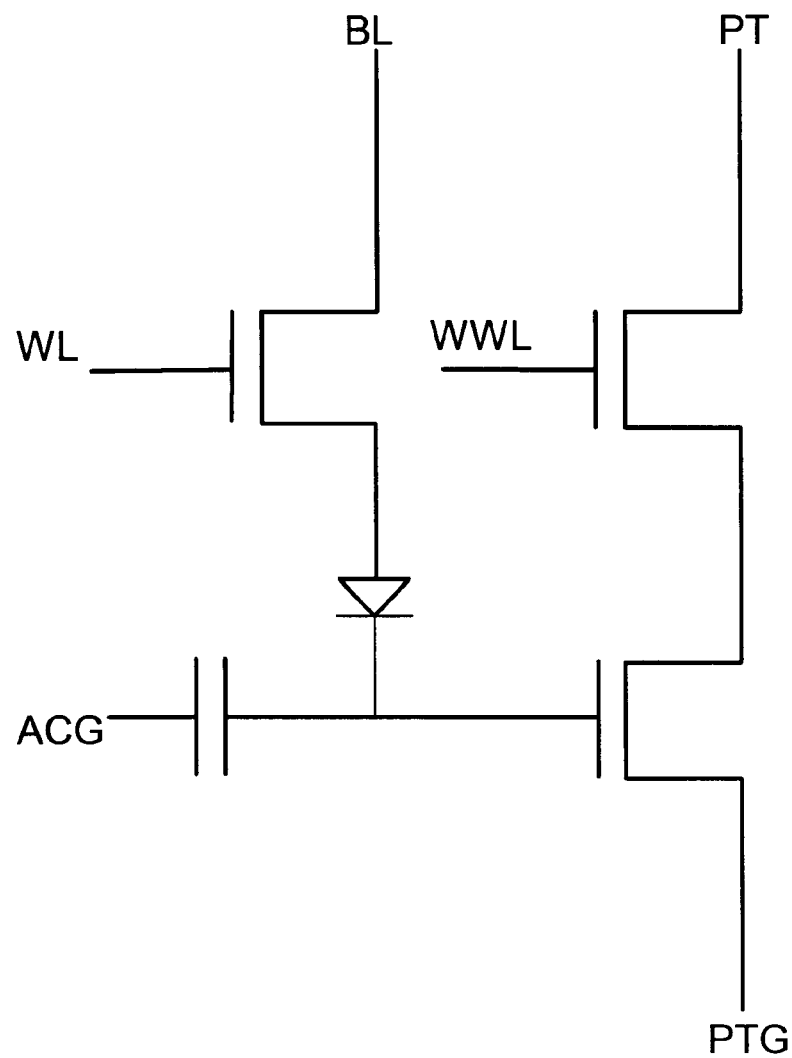
FIG. 1 is a schematic diagram of a prior art EEPROM cell.
Figure 2:
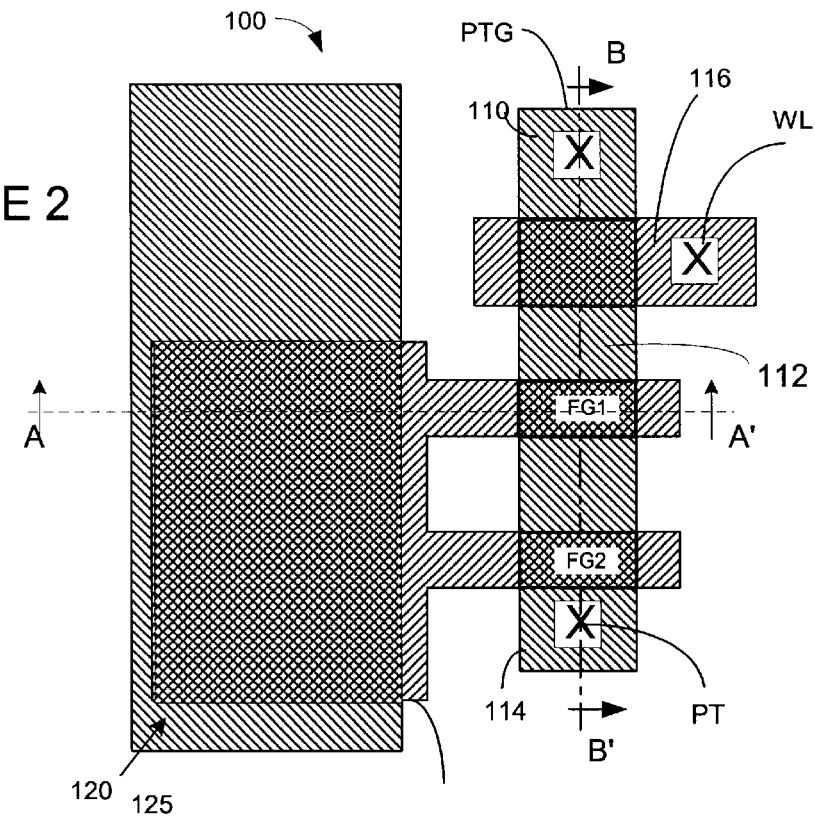
FIG. 2 is a plan view of an EEPROM cell formed in accordance with the present invention.

An EEPROM cell of the present invention will be explained with respect to FIGS. 2–5. FIG. 2 shows a plan view, FIG. 3 a schematic view and FIGS. 4 and 5 partial cross sectional views, of the EEPROM cell of the present invention. In accordance with the invention, an EEPROM cell having a differentially doped floating gate, a method for forming the EEPROM cell and a method for programming a memory cell, are provided. The cell exhibits higher programmed $V_t$ margin due to the use of a lightly doped floating gate over the program junction region for programming through the tunnel window; and maintains erased Vt margin by maintaining the highly doped floating gate over the sense transistor and over the ACG for erasure. This differential doping of the floating gate scheme is performed by blocking doping of the floating gate at the tunnel window which normally occurs during the blanket polysilicon implant using the same mask layer that would be used to mask complementary devices formed on the same chip, therefore allowing the formation of the cell with the same number of processing steps, using only a different mask at N-poly implant masking step.

As shown in FIGS. 2–5, cell 100 comprises a sense transistor 90, a select transistor 80, a floating gate 125 having a first portion FG1 overlying a program junction region PRJ and a second portion FG2 forming the gate of sense transistor 90. The cell is connected to various control voltages (PT, ACG, WL, PTG) via interconnect layers and conductors coupling doped silicon regions or polysilicon regions to control voltages which, in the context of a typical application, will be provided to pin-outs of an integrated circuit device of which any number of cells 100 form a part. An array control gate 135 is formed as a region of impurity in the semiconductor substrate and capacitively coupled to the floating gate 125 via an oxide region.

Transistor 90 includes a first active region 114 coupled to the product term control voltage PT, and shares active region 112 with transistor 80. As shown in FIG. 5, region 112 is a deeply diffused region which forms a program junction (PRJ) and underlies a first portion FG1 of the floating gate 125. Transistor 80 also includes an active region 110 coupled to the product term ground (PTG) control voltage.

Wordline control voltage (WL) is coupled to polysilicon region 116 which serves as the gate for transistor 80. The gate of transistor 80 may be formed in a polysilicon deposition process used to form floating gate 125.

The gate of transistor 90 is formed by a second portion FG2 of floating gate 125. Bias is therefore applied to the program junction region by the bias applied to the floating gate 125 via the ACG, and active regions 114 and 110 via the PT and PTG control voltages respectively, and the Word Line voltage (WL) applied to gate 116.

In cell 100, regions 110, 112 and 114 are provided with a doping concentration of an N-type impurity to a concentration in a range of about $10^{18}$–$10^{20}$ cm$^{-3}$. P- and N-type conductivity materials (known as dopants) are materials commonly known in the art to alter the conductivity of semiconductor material by contributing either a hole (P-type) or an electron (N-type) to the conduction process. For silicon substrates, the dopants are generally found in groups 3 and 5 of the well-known chemical periodic table. In general, the dopant type for each of the active regions will be an n-type impurity such as arsenic, and having a doping concentration in the range of $10^{18}$–$10^{20}$ cm$^{-3}$. Substrate 20 is a p-type substrate having a background doping density of a P-type impurity of $10^{15}$–$10^{17}$ cm$^{-3}$, and is hence referred to herein as a P-substrate. Regions 110, 112, and 114 are formed by, for example, any number of well known implantation and diffusion steps. In additional alternative embodiments, substrate 20 may comprise alternatives to bulk silicon materials well known in the semiconductor industry including, but not limited to, germanium, germanium silicon, gallium arsenide, polysilicon, silicon-on-insulator, or the like.

While the invention is herein described with respect to a P-type substrate with N-type dopants, it will be appreciated that the principles of the invention will be equally applicable to N-type substrates with P-type dopant regions. Indeed, in typical applications, any number of cells of the present invention will be formed on an integrated circuit chip with complementary devices formed on other parts of the chip.

In one embodiment, a single polysilicon layer may be formed and patterned to create the floating gate 125 and the poly layer 116. Following deposition of the polysilicon layer used to form floating gate 125 and poly layer 116, an n-type dopant implant is generally made into all N type polysilicon regions by a dose of $3 \times 10^{15}$–$6 \times 10^{15}$ cm$^{-2}$ phosphorous. Normally, this implant is included in the polysilicon over in the tunnel window, sense transistor gate, ACG capacitor poly gate, and all other NMOS gates (including WL for the select transistor). This highly doped poly is used to avoid the polysilicon depletion effect which reduces drain current in low and high voltage NMOS transistors.

Figure 6:
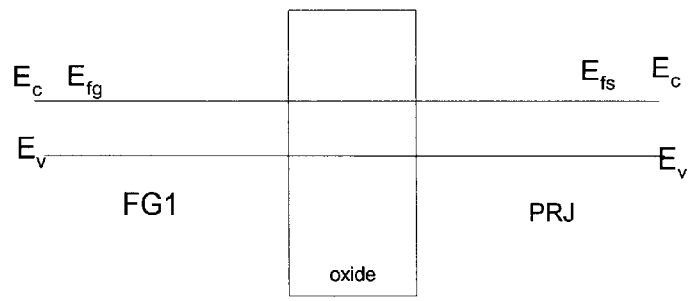
FIGS. 6 and 7 are energy band diagrams showing the Fermi levels of a standard EEPROM cell.
Figure 7:
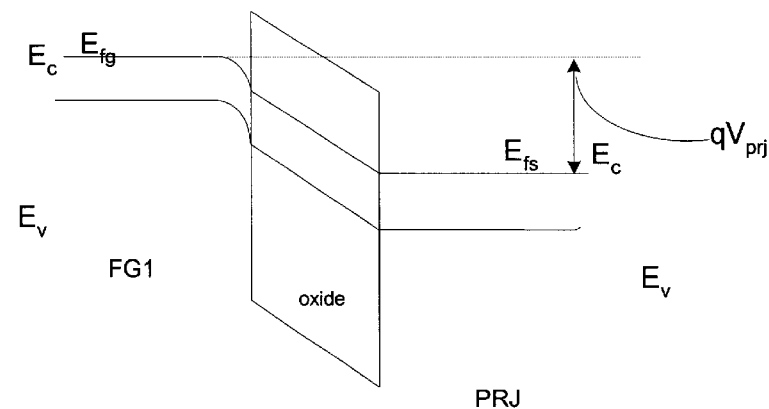

In this typical case, the energy band diagram shown in FIG. 6 illustrates the Fermi level $E_{fg}$ of the gate for doped polysilicon relative to the Fermi level $E_{fs}$ of the N+PRJ regions. In this case, the conduction band $E_c$ of the degenerate program junction PRJ and the degenerate poly region overlying the PRJ would be equal to their respective Fermi level. At equilibrium, they form a flat band. When a voltage $V_{PRJ}$ is applied between the gate and substrate, the band diagram shifts as shown in FIG. 7 and programming tunneling may occur.

In accordance with the invention, a differentially doped floating gate is provided to shift the energy band diagram downward, and increase current flow for the same positive voltage at PRJ for programming. To accomplish this, doping of FG1 at N-poly implant step is inhibited resulting in a differentially doped floating gate 125. That is, FG1 has a lower doping concentration while FG2 and FG are doped with a dose of $3-6 \times 10^{15}$ cm$^{-2}$ phosphorous.

Figure 8:
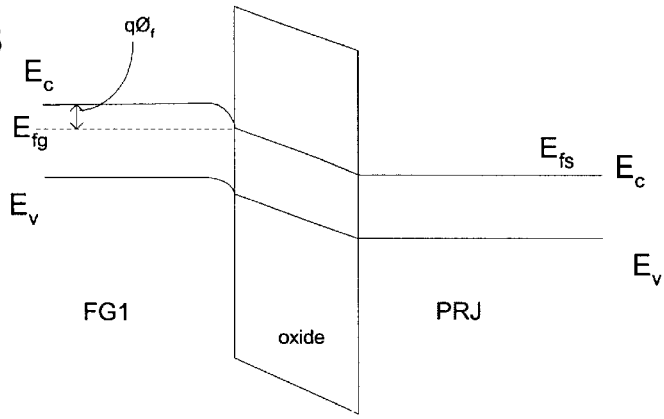
FIGS. 8 and 9 are energy band diagrams of the EEPROM cell of the present invention.
Figure 9:
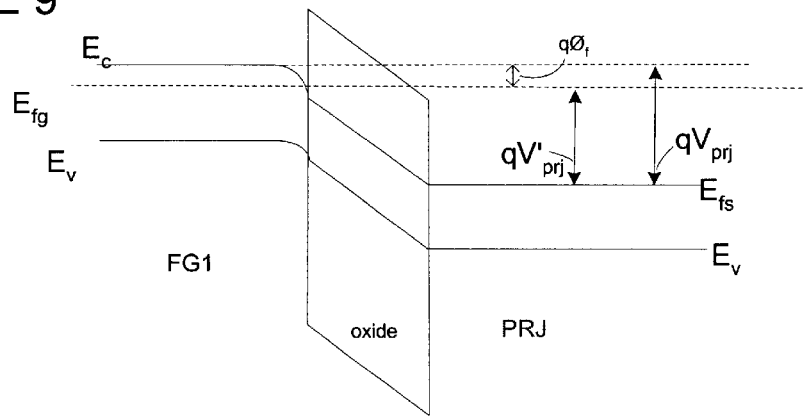

In the device of the present invention, the energy band diagram shifts to that FIG. 8 without bias applied, and FIG. 9 with a bias of $V_{PRJ}$ applied. As shown therein, the start of Fowler Nordheim tunneling is lowered by an amount equal to $(E_c-E_{FG})/q$ (which equals $\Phi_F$). Hence, with the same bias as in the prior art, the tunneling band has a thinner effective barrier and therefore much higher tunneling current results. FIG. 9 shows this effect graphically. And FIG. 10 confirms that much higher programming current is obtained for the present invention at the same bias. In accordance with the invention, the minimum doping of the FG1 gate region may be empirically determined so as not to be too highly resistive such that the floating gate may be at equi-potential and is not doped so lightly that it would not locally trap charges.

Note that reducing the doping of both FG1 and FG2 effectively increases the tunneling thickness for electrons tunneling in the opposite direction (in this case, erasure or charging of the gate). To compensate for this, FG2 is left with the higher dopant concentration so that erasure (or charging) can occur primarily though FG2 since the sense gate has thinner oxide than the tunnel window (underneath FG1).

In operation, voltages as exemplified in Table 2 may be applied to the respective terminals for the cell to erase, program, and read, accordingly:

TABLE 2

|  | PTG | WL | ACG | PT | Substrate |
|---|---|---|---|---|---|
| Erase (charge) | 0 | $V_{cc}$ | $V_{pp}$ | float | 0 |
| Program (discharge) | $V_{pp}$ | $V_{pp}+$ | 0 | float | 0 |
| Read | $V_{read}$ | $V_{cc}$ | 0 | 0 | 0 | where typical values for $V_{cc}$, $V_{pp}$, $V_{read}$ and $V_{pp}+$ are:

| | | |
|---|---|---|
| $V_{cc}$ | = | 1.8V (1.5~2V) |
| $V_{pp}$ | = | 11V (10–13V) |
| $V_{pp}+$ | = | 12V (11.5~12.5V) |
| $V_{read}$ | = | 1.4V (1.0~1.5V) |

In accordance with the foregoing Table, it will be generally understood that the floating gate portion FG1 will be used for discharging (programming) and the floating gate FG1 and FG2 for charging (erasing) the floating gate as follows:

In order to erase EEPROM cell 100, floating gate 125 is given a negative charge by moving electrons to the floating gate 125 by Fowler-Nordheim tunneling. However, unlike previous $E^2$ cells that performed electron tunneling through one oxide window, the present invention provides tunneling the cell via two windows, each optimized for program or erase by the doping of the overlying floating gate region.

In order to move electrons to floating gate 125 to erase EEPROM cell 100, a voltage $V_{pp}+$, for example 12 volts, is applied to ACG, which couples a high potential to FG125 (including FG1 and FG2). The product term (PT) is allowed to float, the wordline (WL) is provided by the voltage $V_{cc}$ of approximately 1.8V, and the product term ground (PTG) is grounded. Since the gate 116 is set at a high voltage ($V_{cc}$) and the drain 110 is grounded, and transistor 80 is "on," both 112 and 190 are grounded. Therefore, a potential is created between floating gate FG2 via ACG coupling and channel 90. The sense gate oxide layer 166 immediately above the channel 90 has a thickness so that electron tunneling occurs through the oxide layer 166, since the voltages previously described provides a sufficient voltage potential between floating gate 125 and channel 190. The voltages provided in this embodiment may vary in alternative embodiments as long as a sufficient potential is created to move electrons through the sense gate oxide layer 167 onto floating gate 125 across tunneling channel 190. The oxide thicknesses of layer 167 may vary as long as the thickness is sufficient to permit electron tunneling at the disclosed potentials and retains charges for a long time. Note that some tunneling current will occur through the tunnel oxide 166 between FG1 and the PRJ as well, meaning both junctions will be used during the erase process. However, the thickness of layer 167 underneath the FG2 is lower and hence the erase characteristics across this layer are superior.

To program the cell, in the same embodiment, electrons are removed from floating gate 125 through oxide layer 166 and FG1. A voltage $V_{pp}$ of, for example, 11 volts, is provided to the product term ground PTG, while a higher voltage $V_{pp}+$of, for example, 12V is applied to wordline WL of transistor 80. The ACG region is set at ground and the product term is allowed to float. Transistor 80 is turned on since the wordline voltage is high, which provides a relatively high voltage $V_{pp}$ to region 112, and with the ACG set at ground, the potential is created between the floating gate 125 and region 112 so that electrons tunnel from floating gate 125 into region 112 through region 112 and FG1. In an array of cells of this type, the erase operation may be performed in bulk, while program operation can be done bit by bit.

A read operation is performed by applying a $V_{cc}$ of 1.8V to wordline WL, applying a read potential voltage $V_{read}$ of 1.4V to the product term ground (PTG) and grounding the product term (PT) and ACG. The detection of a current at the PTG line will determine whether the device is programmed or not, depending on the state of the electrons or holes on floating gate 125.

Figure 11:
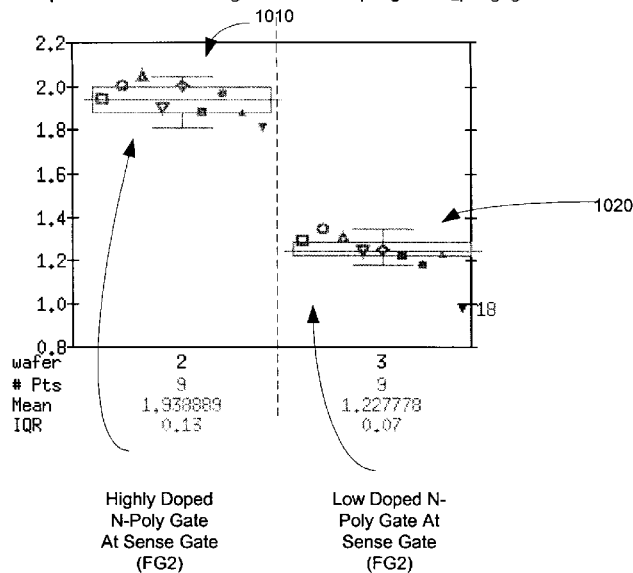
FIG. 11 is a graph depicting the threshold voltage ($V_{te}$) comparison after erasure between high and low doping of the N-poly gate at the sense gate region of the present invention.
Figure 10:
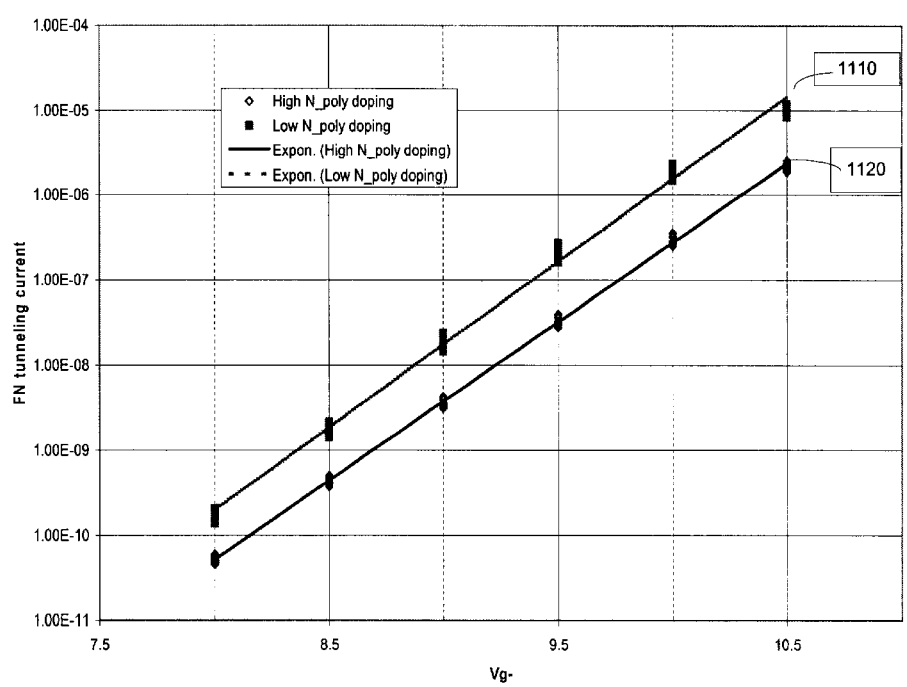
FIG. 10 is a graph depicting the programming current versus the gate voltage for highly doped gate devices versus lowly doped gate regions formed in accordance with the present invention.

FIGS. 10 and 11 are two graphs illustrating the use of differential doping in accordance with the present invention. FIG. 10 presents the programming current in the PRJ capacitor relative to a constant gate voltage ($V_g$) for low doping and high doping of the poly gate in the tunnel window (FG1). Line 1110 illustrates the tunneling current (exponential) relative to the gate voltage for lowly doped gate regions versus line 1120 for highly doped regions for currents in the programming (or dis-charging) direction. As shown therein, the low-doped poly region provides increased current in the programming direction relative to the highly doped gate. However, if the floating gate (FG1/FG2) are all lowly doped, it will have adverse effect on erasure (or charging) as shown in FIG. 11. In FIG. 11, if one were to provide low doping of FG2 as well, the erase $V_{te}$ would be reduced significantly. This will, in turn, reduce the cell threshold voltage margin, which is undesirable in manufacturing cells. By differentially doping the floating gate (between FG1 and FG2) in accordance with the present invention, an increase threshold voltage margin is realized.

In sum, the lowly doped FG1 at the tunnel window provides increased programming current (as shown in FIG. 10) and an increased threshold voltage margin. The highly doped FG2 (at the sense gate) and floating gate FG do not compromise the erase threshold voltage (FIG. 11 left side) and provides a sufficient threshold voltage margin for the cell as a whole in combination with FG1.

Given the foregoing data shown in FIGS. 10 and 11, it will be understood that during the programming process, the tunneling path (FG1/PRJ) is used exclusively, while during erase, both paths (FG1/FG2) are used.

Figure 12A:
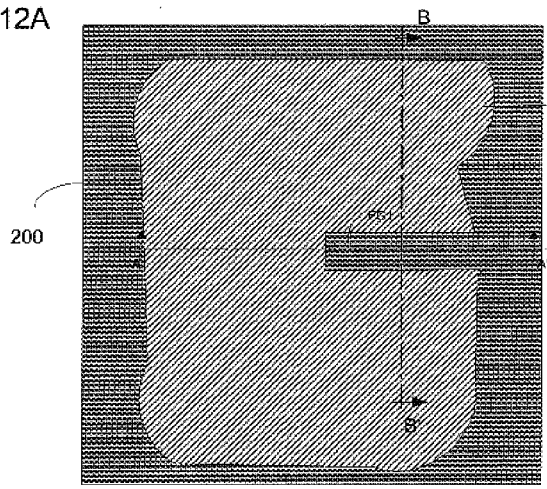
FIG. 12A is a plan view of a device formed in accordance with the present invention showing a masking step.
Figure 12B:
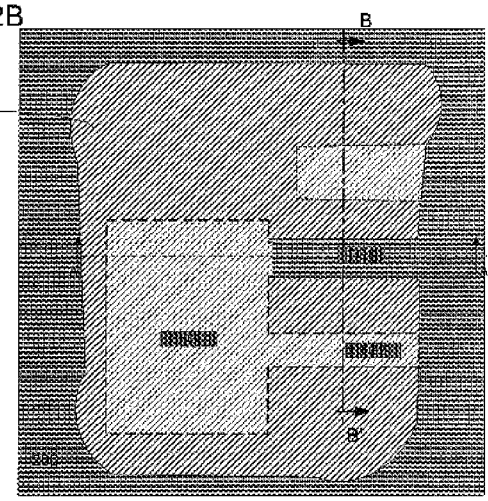
FIG. 12B is a plan view of the device at the processing stage illustrated in FIG. 12A showing how the floating gate region and polysilicon control gate region will be aligned relative to the NPM mask.
Figure 13A:
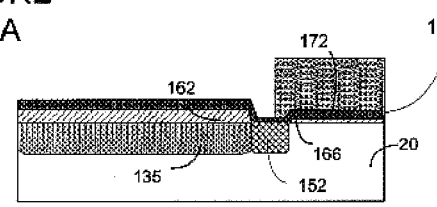
FIG. 13A is a cross sectional view along line A–A' in FIG. 12A.
Figure 13B:
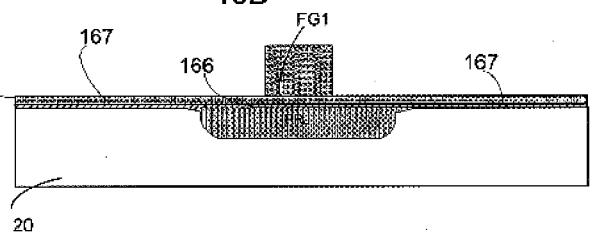
FIG. 13B is a cross sectional view along line B–B' in FIG. 12B.

FIGS. 12A and 12B show a plan views, and FIGS. 13A and 13B cross-section views along lines A–A' and B–B' of FIG. 12A, respectively, illustrating a unique portion of the sequence of manufacturing for the EEPROM cell of the present invention. As illustrated therein, a mask is used to block implantation of FG1 while leaving other regions of the floating gate exposed to an N-type dopant implant of $3$–$6 \times 10^{15}$ cm$^{-2}$.

In forming the memory cell of the present invention, the mask layer 200 is a mask which would normally be used in completing the formation of complementary devices on a single integrated circuit device having complementary devices. In such a process, modification of this mask layer allows manufacture of the invention without additional process steps.

In general, it should be understood by one of average skill in the art that the steps described herein for manufacturing the invention are exemplary only and constitute only a portion of the manufacturing process for constructing an integrated circuit device incorporating the cell of the present invention. In particular, periphery transistors utilized to control, for example, the product term ground (PTG), wordline (WL) and ACG voltages are formed in additional process steps not herein described but which are readily apparent and known to one of average skill in the art. In addition, it should be understood that a plurality of like cells 100 are arranged in arrays with row and columnar connectors. It should be further understood that any number of cleaning steps may be utilized at various points in the following description.

FIG. 13A shows a substrate 20 in which a plurality of active areas separated by an isolation region 152 are formed. The isolation region 152 is formed by conventional trench isolation techniques and isolates the ACG 135 from the remainder of the transistors utilized in the cell. It should be recognized that the form of isolation regions 152 is not specific to the principles of the invention, and alternative forms of device isolation, such as LOCOS, shallow trench isolation, deep trench isolation, and the like, may be used in accordance with the present invention.

Region 135 is formed by implanting an N-type dopant such as arsenic or phosphorous through any of a number of well-known processes. Region 135 may be doped by a dose of $10^{14}$–$10^{15}$ cm$^{-2}$ and will come to constitute the ACG region of the cell of the present invention. The PRJ region at the tunnel window may be formed by the same implant, followed by a deep diffusion step of heating the substrate to drive the dopant to a predetermined depth within the substrate.

Following formation of the active regions, an oxide regions 162, 166 and 167 may be formed in a single step or multiple steps by immersing substrate 20 in an oxygen atmosphere and heating the substrate to grow a thermal oxide of a thickness of approximately 84~103 Å across the wafer.

Following formation of the foregoing oxide a polysilicon layer which will form the basis of the floating gate region FG, gates FG1 and FG2 and control gate 116 is deposited.

Next, an n-poly implant mask (NPM) 200 is applied over the substrate. The device will now have the appearance shown in FIGS. 12A, 13A and 13B.

In accordance with the present invention, the mask layer 200 is a mask layer which is used in the conventional process step of forming an integrated circuit with complementary NMOS and PMOS transistors to accomplish implantation of n-type impurities in the polysilicon of one type of transistor, while protecting those of the complementary type of transistor.

Mask 200 is generally used in the NMOS side of the circuit—which would normally expose all portions of the polysilicon layer forming floating gate 125 and gate 116 to the implant. In accordance with the invention, mask 200 is formed with a blocking region 210 overlying at least a portion of FG1 (as illustrated in FIG. 12B). As such, the implant will not affect FG1 but will be provided to the floating gate 125 and FG2. Implementing this masking step is effected by simply changing the exposure mask used to pattern the photoresist layer 205 prior to the exposure step.

The n-type dopants are then implanted into the poly layer and the process of forming the device continues with a number of processing steps well known in the art. In one aspect, a gate mask is applied to the substrate followed by a gate etch to form the floating gate FG, FG1, FG2 and control gate 116. A lightly doped-drain implant may then be used along with a spacer deposition and etch steps to form LDD regions in accordance with well known techniques. This may be followed by high implantation of the active regions 114, 112, and 110 by, for example, implanting an impurity such as arsenic or phosphorous using a photolithographic implant mask.

Figure 3:
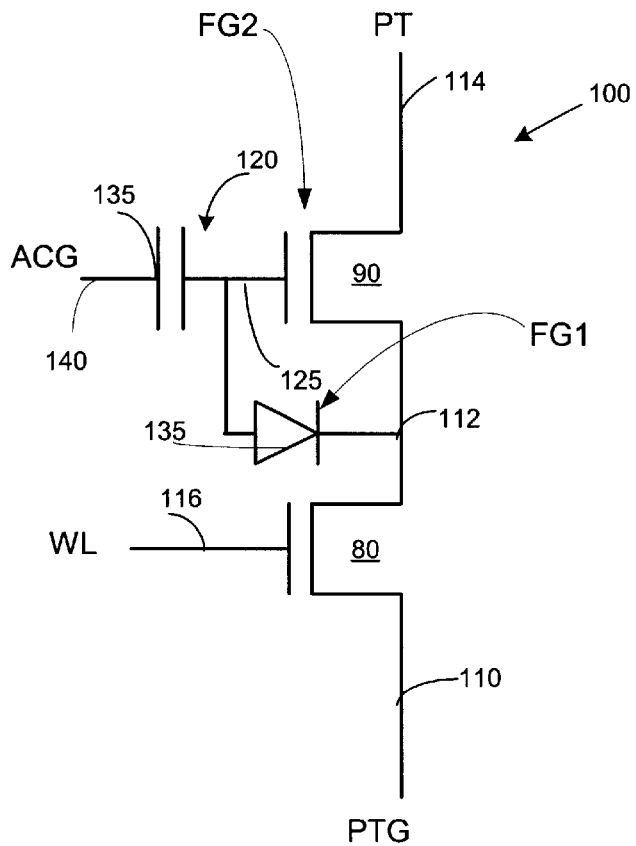
FIG. 3 is a schematic diagram of the EEPROM cell of the present invention.

The resulting structure is shown in FIGS. 4 and 5, which are cross sections of the cell as shown in FIG. 3 along lines A–A' and B–B', respectively.

In this manner, the present invention accomplishes the manufacture of the device of the invention and that the attendant advantages thereof without implementing additional process steps.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An EEPROM cell, comprising:

a sense transistor and a select transistor, each having a first active region formed in a substrate, and sharing a second active region;

a floating gate having a first portion forming a gate region for said sense transistor, and a second portion overlying the second active region and forming a program junction with said second active region, wherein said first portion of said floating gate has a concentration of an impurity greater than a concentration of said impurity in the second portion of the floating gate.

2. The EEPROM of claim 1 wherein the cell further includes a control region formed in the substrate and underlying a third portion of said floating gate, the third portion of the floating gate having said concentration of an impurity said first portion of said floating gate.

3. The EEPROM of claim 1 wherein said impurity is an n-type impurity.

4. The EEPROM of claim 3 wherein said concentration of said impurity in said first portion is in a range of about $10^{18}$–$10^{20}$ cm$^{-3}$.

5. The EEPROM of claim 1 wherein said floating gate is formed of a single polysilicon layer.

6. The EEPROM of claim 1 wherein said select transistor includes a select transistor gate formed of a single polysilicon layer.

7. A memory cell, comprising:

a floating gate having at least a first region having a first impurity concentration and a second region having a second impurity concentration different from said first impurity concentration;

a first active region formed in a substrate;

a control gate formed adjacent to said first active region; and a second active region formed in the substrate adjacent to said control gate and said second active region, and including a program junction region, the program junction region underlying said first region of said floating gate.

8. The memory cell of claim 7 further including an array control gate region in said substrate underlying a third portion of said floating gate.

9. The memory cell of claim 8 wherein said floating gate and said control gate are formed of a first layer of polysilicon.

10. The memory cell of claim 7 wherein said first impurity concentration is less than said second impurity concentration.

11. The memory cell of claim 10 wherein said second impurity concentration is in a range of about $10^{18}$–$10^{20}$ cm$^{-3}$.

12. The memory cell of claim 10 wherein said first impurity concentration comprises the background concentration of deposited polysilicon.

13. The memory cell of claim 7 wherein said third portion and said second portion of said floating gate have said second impurity concentration.

14. The memory cell of claim 13 wherein said impurity concentration is of an n-type impurity.

15. A memory cell, comprising:

a first tunneling region and a second tunneling region; and a floating gate having a first impurity concentration over said first tunneling region and a second impurity concentration adjacent to said second tunneling region, wherein said first tunneling region comprises a diffused program junction region in a first active region formed in the substrate and a first portion of said floating gate.

16. The memory cell of claim 15 wherein said second tunneling region comprises a second portion of said floating gate and a channel region adjacent to said first active region.

17. The memory cell of claim 16 further including a second active region separated from said first active region by the channel region, and wherein said second region of said floating gate overlies said channel region.

18. The memory cell of claim 17 further including a third active region separated from said first active region by a second channel and a control gate.

19. A memory cell, comprising:

a first tunneling region and a second tunneling region; and a floating gate having a first impurity concentration over said first tunneling region and a second impurity concentration adjacent to said second tunneling region, wherein each of said first and second impurity concentration comprises an n-type impurity, and said first impurity concentration is less than said second impurity concentration.

20. The memory cell of claim 19 wherein said second impurity concentration is in a range of about $10^{18}$–$10^{20}$ $cm^{-3}$.

21. A memory cell, comprising:

a first tunneling region and a second tunneling region; and a floating gate having a first impurity concentration over said first tunneling region and a second impurity concentration adjacent to said second tunneling region, wherein said second tunneling region provides erasure tunneling and said first tunneling region provides program tunneling.

22. The memory cell of claim 21 wherein said erasure tunneling comprises charging the floating gate and said program tunneling comprises discharging the floating gate.

23. A memory cell, comprising:

a first tunneling region and a second tunneling region; and a floating gate adjacent to said first tunneling region and adjacent to said second tunneling region, wherein said second tunneling region provides erasure tunneling to the floating gate and said first tunneling region provides program tunneling to the floating gate.

* * * * *